US009075324B2

(12) United States Patent
Zimmerman et al.

(10) Patent No.: US 9,075,324 B2
(45) Date of Patent: Jul. 7, 2015

(54) BEAM POSITIONING AND POINTING

(75) Inventors: Richard Carl Zimmerman, Brookfield, CT (US); Roberto B. Wiener, Ridgefield, CT (US)

(73) Assignee: ASML Holding N.V., Veldhoven (NL)

( * ) Notice: Subject to any disclaimer, the term of this patent is extended or adjusted under 35 U.S.C. 154(b) by 911 days.

(21) Appl. No.: 11/840,821

(22) Filed: Aug. 17, 2007

(65) Prior Publication Data

US 2009/0046338 A1    Feb. 19, 2009

(51) Int. Cl.
*G03B 27/54* (2006.01)
*G03B 27/42* (2006.01)
*G03B 27/32* (2006.01)
*G03F 7/20* (2006.01)
*G02B 26/08* (2006.01)

(52) U.S. Cl.
CPC .......... *G03F 7/7085* (2013.01); *G02B 26/0875* (2013.01); *G03F 7/70191* (2013.01)

(58) Field of Classification Search
CPC ............ G03F 7/70091; G03F 7/70141; G03F 7/7085; G03F 7/70191; G02B 26/0875
USPC ................................................ 355/67, 53, 77
See application file for complete search history.

(56) References Cited

U.S. PATENT DOCUMENTS

| | | | | |
|---|---|---|---|---|
| 6,081,320 A * | 6/2000 | Tanitsu | ........................... | 355/71 |
| 6,100,961 A * | 8/2000 | Shiraishi et al. | ................ | 355/67 |
| 2003/0164933 A1 | 9/2003 | Nishi et al. | | |
| 2005/0078292 A1 * | 4/2005 | Bruebach | ........................ | 355/67 |
| 2005/0270510 A1 * | 12/2005 | Botma | ............................ | 355/67 |
| 2006/0158615 A1 | 7/2006 | Williamson | | |
| 2008/0088814 A1 | 4/2008 | Kajiyama et al. | | |
| 2009/0046373 A1 | 2/2009 | Ryzhikov et al. | | |

OTHER PUBLICATIONS

Non-Final Rejection mailed Jun. 11, 2010 for U.S. Appl. No. 11/933,894, 8 pgs.
Zimmerman et al., U.S. Office Action mailed Nov. 19, 2010, directed to related U.S. Appl. No. 11/933,894; 10 pages.
Notice of Allowance dated Mar. 3, 2011, directed to related U.S. Appl. No. 11/933,894, filed Nov. 1, 2007; 10 pages.
Notice of Allowance mailed Jun. 23, 2011, for related U.S. Appl. No. 11/933,894, filed Nov. 1, 2007; 8 pages.

* cited by examiner

*Primary Examiner* — Peter B Kim
(74) *Attorney, Agent, or Firm* — Sterne, Kessler, Goldstein & Fox P.L.L.C

(57) ABSTRACT

A beam pointing and positioning system includes a first lens, movable in a first plane perpendicular to a nominal optical axis, which receives and positions a light beam. The system also includes a second lens, movable in a second plane perpendicular to the nominal optical axis, which receives and points the positioned light beam. The system is thereby capable of directing the light beam to a desired location at a desired angle. The system may also include a beam splitter that receives, transmits, and reflects the pointed light beam, one or more sensors that receive the reflected light beam, and a controller coupled to the sensor(s) and first and second lenses. The controller may control the positioning of the first and second lenses based on beam position and pointing data and/or signals received from the sensor(s). A method of positioning and pointing a light beam is also presented.

37 Claims, 8 Drawing Sheets

(VIEW 1)   (VIEW 2)

BEAM POSITIONING AND POINTING

BACKGROUND

1. Field of the Invention

The present invention is directed generally to optics. More particularly, the present invention relates to beam positioning and pointing for use in lithographic processing.

2. Related Art

A lithographic apparatus is a machine that applies a desired pattern onto a substrate or part of a substrate. A lithographic apparatus may be used, for example, in the manufacture of flat panel displays, integrated circuits (ICs) and other devices involving fine structures. In a conventional apparatus, light is directed to a patterning device, which may be referred to as a mask, a reticle, an array of individually programmable or controllable elements (maskless), or the like. The patterning device may be used to generate a circuit pattern corresponding to an individual layer of an IC, flat panel display, or other device. This pattern may be transferred onto all or part of the substrate (e.g., a glass plate, a wafer, etc.), by imaging onto a layer of radiation-sensitive material (e.g., resist) provided on the substrate. The imaging may include the processing of light through a projection system, which may include optical components such as mirrors, lenses, beam splitters, and the like. Other components or devices may exist in a lithographic apparatus that can also contain optical components.

The positioning and pointing of a light beam used in lithography is conventionally accomplished using closed-loop beam steering. In closed-loop beam steering, one or more mirrors (typically at least two) can be controllable in X and Y rotations (Rx and Ry). The mirrors may be adjusted based on feedback from one or more beam position sensors and/or tilt measurement sensors. Although some systems use a single lens to control pointing (i.e., telecentricity) of the beam, in which the single lens is shifted in-plane (i.e., controllable in X and Y) to change beam pointing, conventional systems do not include both beam positioning and pointing without adding mirrors. The addition of mirrors requires additional volume for folding and may also produce undesirable polarization effects for large angles of incidence. The need to add mirrors also increases system cost.

BRIEF SUMMARY

In an embodiment, a beam positioning and pointing system includes a first lens, movable in a first plane perpendicular to a nominal optical axis, which receives and positions a light beam. The system also includes a second lens, movable in a second plane perpendicular to the nominal optical axis, which receives and points the positioned light beam. The system is thereby capable of directing the light beam to a desired location at a desired angle.

In one example, the system may also include a beam splitter that receives, transmits, and reflects the pointed light beam, one or more sensors that receive the reflected light beam, and a controller coupled to the one or more sensors and first and second lenses. The controller may control the positioning of the first and second lenses based on beam position and pointing data and/or one or more signals received from the one or more sensors. In one embodiment, the first and second lenses, the beam splitter, and the one or more sensors are associated with a single structure. In an alternative embodiment, the first and second lenses are associated with a first structure, and the beam splitter and the one or more sensors are associated with a second structure that is separate from the first structure.

In one example, a beam pointing and positioning system includes an adjustable first optical component arranged to receive and position a light beam, and an adjustable second optical component arranged to receive and point the positioned light beam along a nominal optical axis. In one embodiment, the first and second optical components may be lenses. In another embodiment, one of the first and second optical components may be a mirror.

A method of positioning and pointing a light beam is also presented. In an embodiment, a light beam is directed toward a first lens. A position of the first lens is adjusted within a first plane perpendicular to a first nominal optical axis to adjust the light beam's left-right position, while directing the light beam toward a second lens. A position of the second lens is adjusted within a second plane perpendicular to the first nominal optical axis to adjust the light beam's up-down position to direct the light beam along or within a second nominal optical axis. In one embodiment, the first and second nominal optical axes are the same. In an alternative embodiment, the first and second nominal optical axes are different. In one embodiment, the directing and adjusting steps occur during setup of a lithographic operation. In an alternative embodiment, the directing and adjusting steps occur dynamically (i.e., in real time) during a lithographic operation.

In one example, the method may further include directing the light beam from the second lens to one or more sensors, providing data and/or one or more signals from the sensors to a controller, and repeating the adjusting steps, the directing the light beam to one or more sensors step, and the providing step as needed at the direction of the controller based on the data and/or one or more signals provided by the one or more sensors.

A lithography system is also presented. In an embodiment, the lithography system includes a source of radiation configured to emit a beam of radiation, an illumination system configured to process the beam of radiation, a patterning device configured to pattern the processed beam of radiation, a projection system that projects the patterned beam of radiation onto a target portion of a substrate, and a beam pointing and positioning system located upstream of the patterning device. In an embodiment, the lithography system may also include a beam delivery system configured to receive the beam of radiation from the source of radiation and direct the beam of radiation to the illumination system. The beam pointing and positioning system includes a first lens, movable in a first plane perpendicular to a first nominal optical axis, that receives and positions the beam of radiation, and a second lens, movable in a second plane perpendicular to the first nominal optical axis, that receives and points the positioned beam of radiation, such that the beam of radiation received by the beam pointing and positioning system is directed to a location at an angle along a second nominal optical axis. In an embodiment, the first and second nominal axes are the same. In an alternative embodiment, the first and second nominal axes are different.

In various embodiments, the beam pointing and positioning system may be located in one or more of the following example locations: downstream of the source of radiation and upstream of the beam delivery system along an optical path, downstream of the beam delivery system and upstream of the illumination system along an optical path, within the illumination system, and upstream of the patterning device along an optical path.

In an embodiment, the lithography system also includes a beam splitter configured to receive, transmit, and reflect the pointed beam of radiation, one or more sensors configured to receive the reflected beam of radiation, and a controller, coupled to the one or more sensors and the first and second lenses, configured to control the positioning of the first and second lenses based on data and/or one or more signals received from the one or more sensors. In an embodiment, the first and second lenses, the beam splitter, and the one or more sensors are associated with a single structure. In an alternative embodiment, the first and second lenses are associated with a first structure, and the beam splitter and the one or more sensors are associated with a second structure that is separate from the first structure.

In an embodiment, a beam control system for lithographic processing includes a first lens disposed in an optical path of a light beam and a second lens disposed in the optical path to receive the light beam from the first lens. The beam control system also includes a first lens actuator coupled to the first lens. The first lens actuator is configured to move the first lens in a first plane perpendicular to a nominal optical axis to position the light beam in response to a first actuation signal by directing the light beam to a desired location. A second lens actuator is coupled to the second lens. The second lens actuator is configured to move the second lens in a second plane perpendicular to the nominal optical axis to point the positioned light beam in response to a second actuation signal by directing the light beam at a desired angle. In an embodiment, a controller coupled to the first and second lens actuators provides the first actuation signal to control position of the light beam and provides the second actuation signal to control pointing of the light beam. In a further embodiment, one or more sensors are coupled to the controller. A first sensor may detect position of the light beam at a particular location. A second sensor may detect pointing of the light beam at a particular angle. In a still further embodiment, a feedback loop is coupled to the first and second sensors. The feedback loop may control shifting of the first lens in the first plane based on a first sensor signal and/or shifting of the second lens in the second plane based on a second sensor signal for correcting pointing or positioning errors during lithographic processing.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 4A:
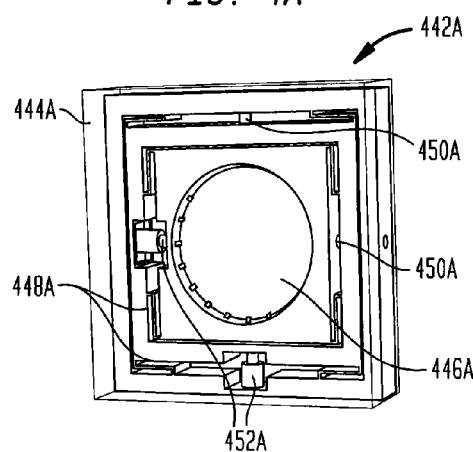
Figure 4B:
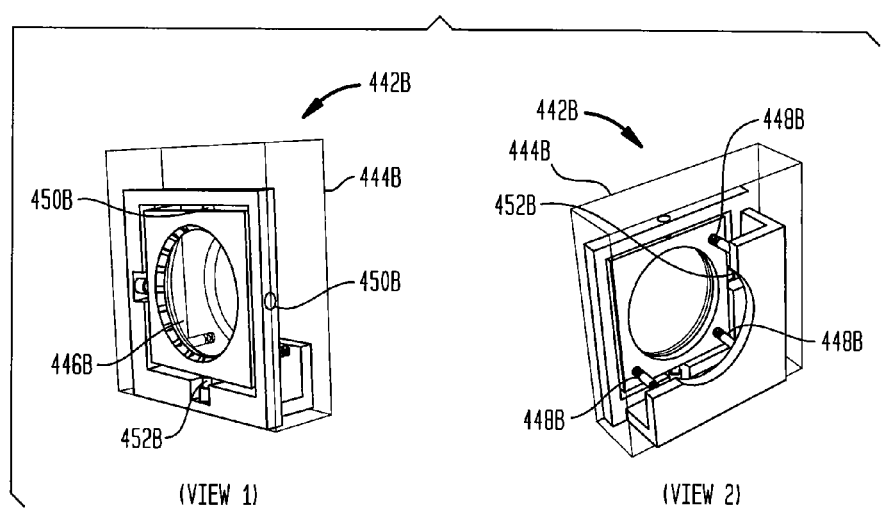

FIGS. 4A and 4B each depict a lens mounting example that includes actuators for adjusting lens position.

Figure 5:
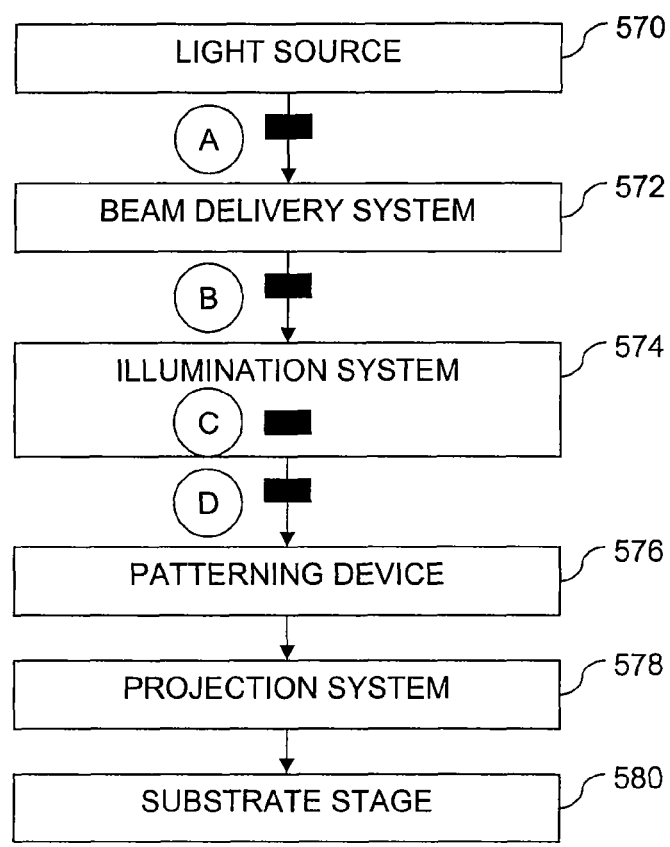

FIG. 5 is a block diagram of an exemplary lithography system that may include a beam positioning and pointing system, according to an embodiment of the present invention.

Figure 6:
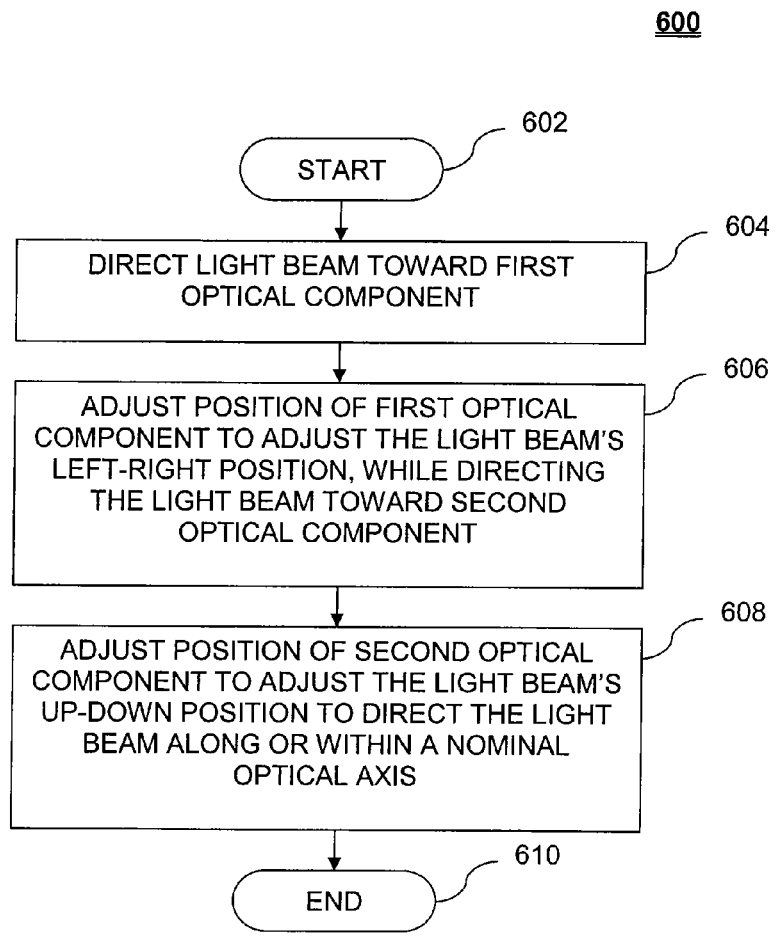

FIG. 6 is a flowchart depicting a method of positioning and pointing a light beam, according to an embodiment of the present invention.

Figure 7:
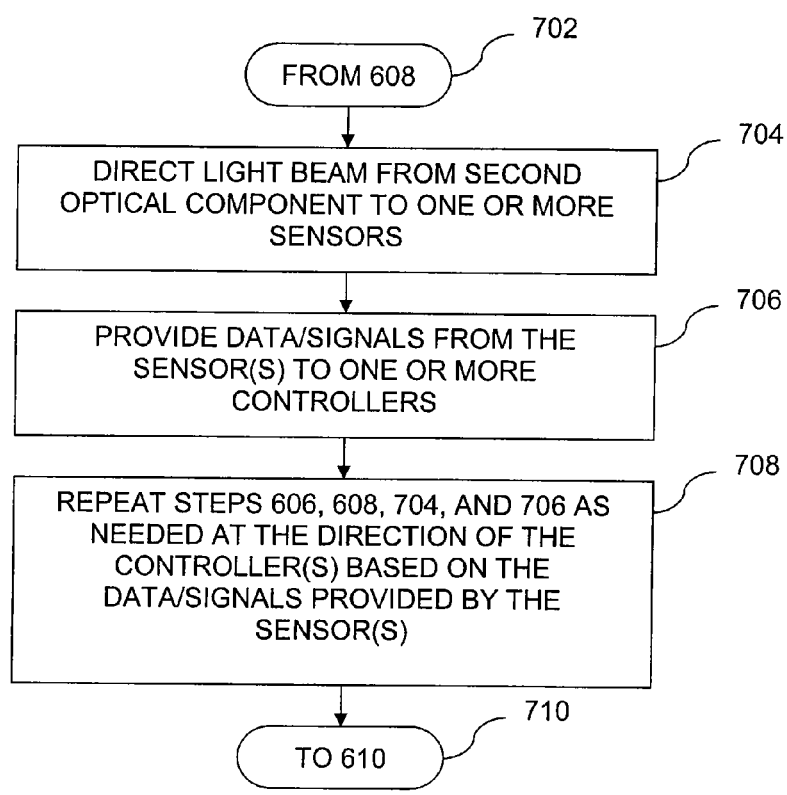

FIG. 7 is a flowchart depicting further steps of the method shown in FIG. 6, according to an embodiment of the present invention.

Figure 1:
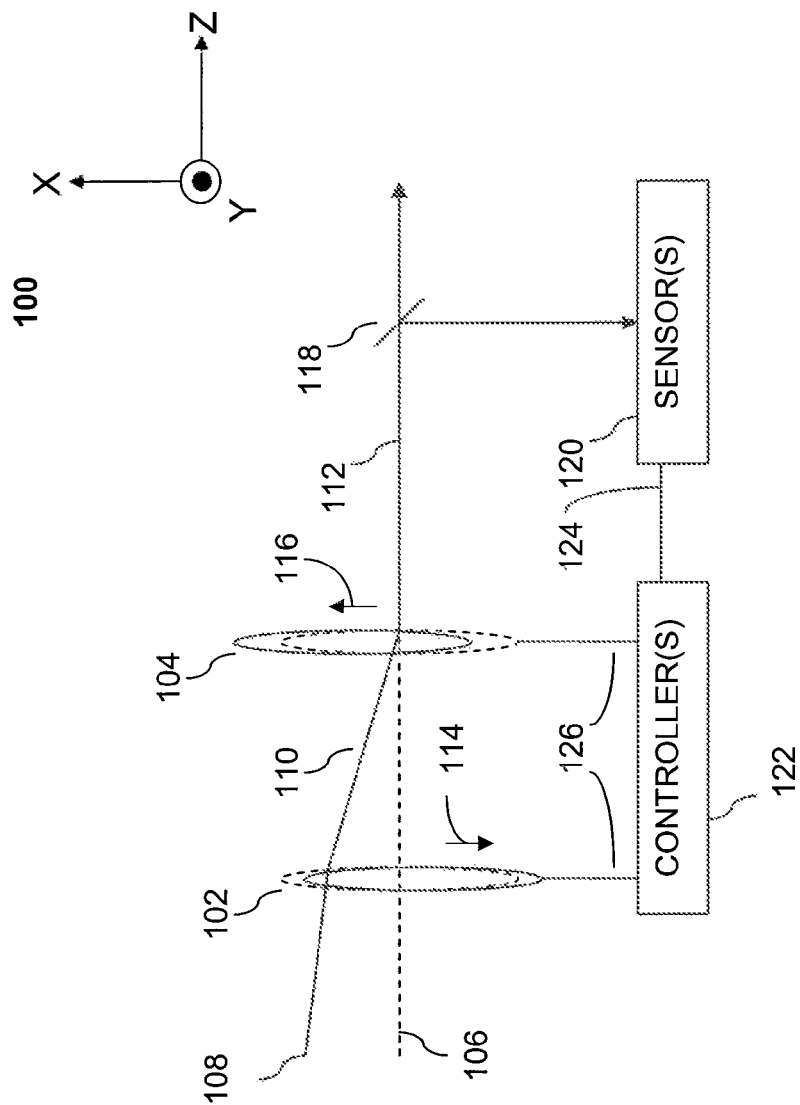
FIG. 1 is a diagram of an exemplary beam positioning and pointing system, according to an embodiment of the present invention.
Figure 3:
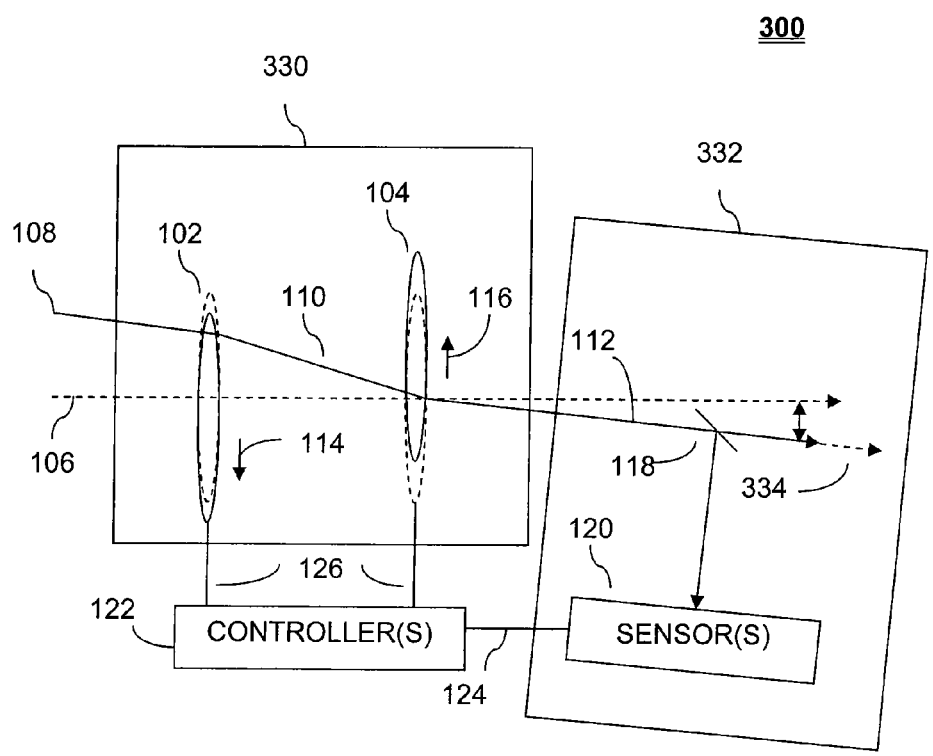
FIG. 3 is a diagram of an exemplary beam positioning and pointing system involving more than one structure, according to an embodiment of the present invention.
Figure 8:
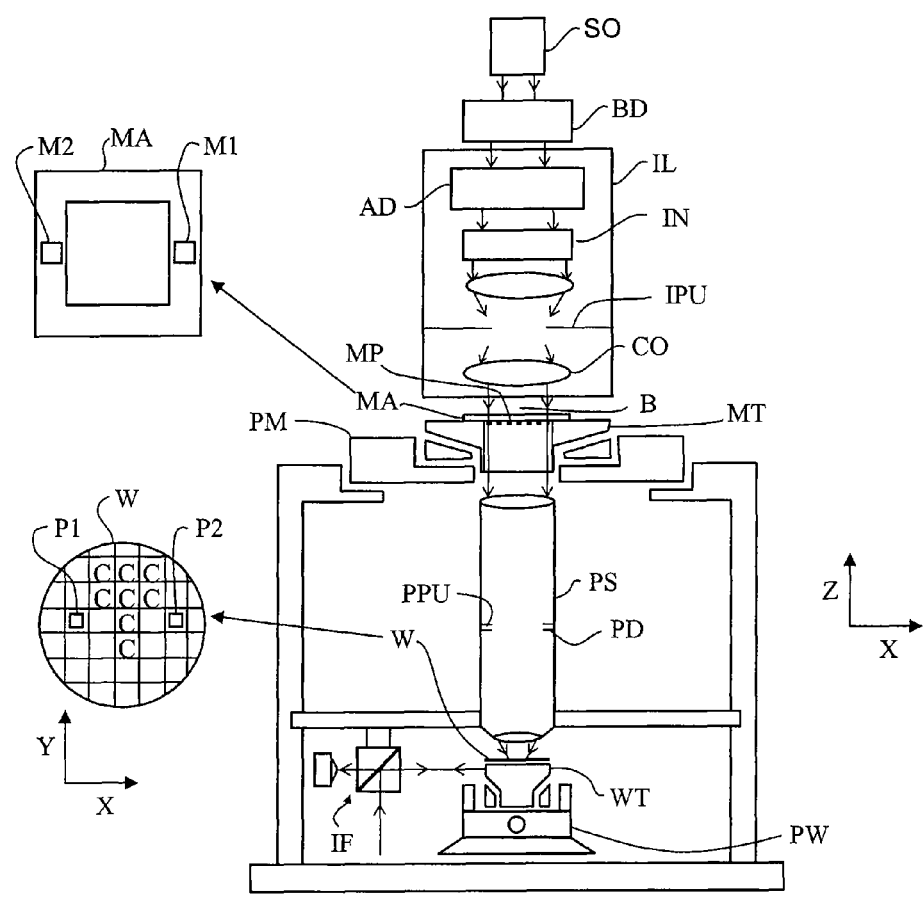

FIG. 8 is another exemplary lithography system, which may include the exemplary beam positioning and pointing system of FIGS. 1 and 3.

The present invention will be described with reference to the accompanying drawings. The drawing in which an element first appears is typically indicated by the leftmost digit(s) in the corresponding reference number.

DETAILED DESCRIPTION OF THE INVENTION

While specific configurations, arrangements, and steps are discussed, it should be understood that this is done for illustrative purposes only. A person skilled in the pertinent art(s) will recognize that other configurations, arrangements, and steps may be used without departing from the spirit and scope of the present invention. It will be apparent to a person skilled in the pertinent art(s) that this invention may also be employed in a variety of other applications.

It is noted that references in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of one skilled in the art to incorporate such a feature, structure, or characteristic in connection with other embodiments whether or not explicitly described.

FIG. 1 is a diagram of an exemplary beam positioning and pointing system 100, according to an embodiment of the present invention. Beam positioning and pointing system 100 includes a first lens 102 and a second lens 104. The first lens 102 may be adjusted in its X-Y plane, perpendicular to a nominal optical axis 106, to position a received light beam 108 by adjusting the left-right positioning of light beam 108 to be along or within nominal optical axis 106, such that resulting light beam 110 and nominal optical axis 106 are perpendicular to the X-Y plane of first lens 102. The second lens 104 may be adjusted in its X-Y plane, perpendicular to nominal optical axis 106, to point light beam 110, such that resulting light beam 112 travels along or within nominal optical axis 106. In the example shown, first lens 102 is adjusted in the direction signified by arrow 114, and second lens 104 is adjusted in the direction signified by arrow 116. As would be understood by one skilled in the relevant art(s), other optical components, such as a mirror, can be substituted for either of the first and second lenses.

First lens 102 and second lens 104 may be made of fused silica, Zerodur® (produced by SCHOTT Corporation), Ultra Low Expansion (ULE®) glass (produced by Corning Inc.), calcium fluoride, optical glass, Germanium, Silicon, other infrared (IR) materials, or any other material commonly known to be used in the manufacture of optical components.

In an embodiment, a control system comprised of sensor(s) 120 and controller(s) 122 is used to control first lens 102 and second lens 104. In this embodiment, a beam splitter 118 reflects light beam 112 toward one or more beam position and pointing sensors 120. The beam position and pointing sensors 120 provide data and/or one or more signals 124 relating to the beam position and pointing to one or more controllers 122. Controllers 122 control the positions of first lens 102 and second lens 104 with signals 126 based on the beam position and pointing data and/or one or more signals 124 provided by sensors 120. Controllers 122 may be made up of one or more computing systems, for example.

Figure 2A:
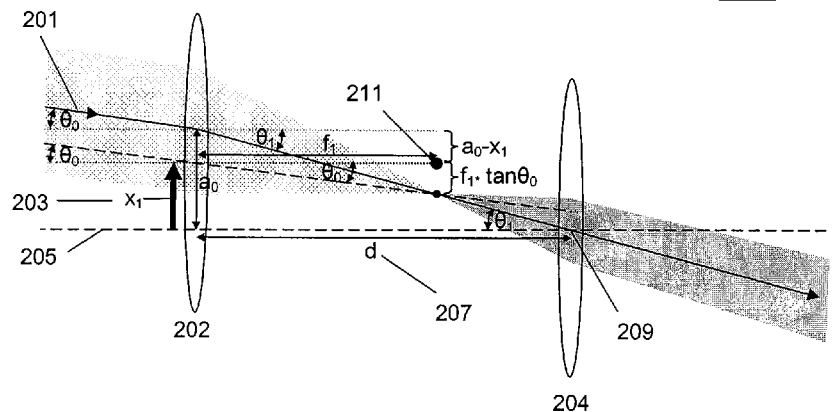
FIGS. 2A and 2B depict further detail of the physics involved with an exemplary beam positioning and pointing system, such as that depicted in FIG. 1, according to an embodiment of the present invention.
Figure 2B:
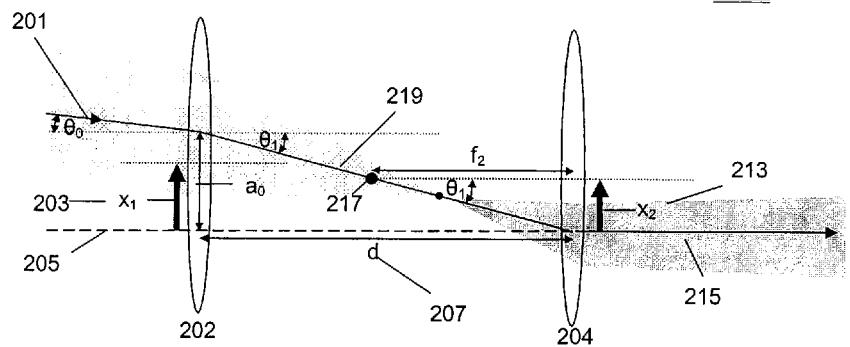

FIGS. 2A and 2B depict further detail of the physics involved with an exemplary beam positioning and pointing system, such as that depicted in FIG. 1, according to an embodiment of the present invention. FIGS. 2A and 2B show an example of a beam positioning and pointing system 200 A/B with a collimated input beam having its chief ray 201 at an angle $\theta_0$ and which intersects a first lens 202 at position $a_0$. A thin lens approximation may be used.

Referring to FIG. 2A, first lens 202 may be moved a distance $x_1$ (203) in the direction indicated to position the chief ray 201 to a nominal optical axis 205 at a second lens 204 (at point 209) that is located a distance d (207) from first lens 202. The following equations (Equations 1 and 2) can be derived from standard thin-lens geometric optics:

$$\tan \theta_1 = a_0/d \qquad \text{Equation 1}$$

$$\tan \theta_1 = \{(a_0 - x_1) + f_1 * \tan \theta_0\}/f_1 \qquad \text{Equation 2}$$

where $\theta_1$ is as shown in FIG. 2A, $a_0$ is the position of first lens 202, d is the distance between first lens 202 and second lens 204, $x_1$ is the distance first lens 202 is moved, $f_1$ is the distance from first lens 202 to its focal point 211, and $\theta_0$ is the initial angle of chief ray 201.

Referring to FIG. 2B, second lens 204 may be moved a distance $x_2$ (213) in the direction indicated to point ray 215 exiting second lens 204 along nominal optical axis 205. This can be achieved by moving second lens 204 such that its focal point 217 intersects positioned ray 219. The following equation (Equation 3) can be derived from standard thin-lens geometric optics:

$$\tan \theta_1 = x_2/f_2 \qquad \text{Equation 3}$$

where $x_2$ is the distance second lens 204 is moved, and $f_2$ is the distance from second lens 204 to its focal point 217.

Combining Equations 1, 2, and 3 yields Equations 4 and 5 (below), which provide the required movements of first lens 202 and second lens 204 to align the beam along nominal optical axis 205:

$$x_1 = a_0 + f_1 * (\tan \theta_0 - a_0/d) \qquad \text{Equation 4}$$

$$x_2 = f_2 * a_0/d \qquad \text{Equation 5}$$

Beam positioning and pointing system 100 may represent a beam positioning and pointing system that may be used with an optical system, such as a lithography system, involving a single structure. The improper position and/or pointing of light beam 108 may be due to vibration, for example, of the single structure. However, system 100 may also be used to maintain beam position and pointing between two structures moving relative to one another (e.g., as seen in FIG. 3).

For example, a lithography system may have one or more break points between system components. Position and pointing correction as provided by the present invention may be used at one or more of such break points. Beam positioning and pointing system 300 of FIG. 3 shows an example of this.

Beam positioning and pointing system 300 is similar to beam positioning and pointing system 100, except that two separate structures are involved (330 and 332). For this reason, resulting light beam 112 may be required to be directed along or within a nominal optical axis 334 that is different than nominal optical axis 106. In an embodiment that involves two or more structures and a control system, beam splitter 118 and sensors 120 are associated with a structure separate from first lens 102 and second lens 104, as shown in FIG. 3.

The adjusting of first lens 102 and second lens 104 may be done dynamically (i.e., in real time) to correct pointing and positioning errors, during lithographic processing for example. A control system, such as that including beam splitter 118, sensors 120, and controllers 122, may be used as a feedback loop to accomplish this dynamic adjustment. Alternatively, the adjusting of first lens 102 and second lens 104 may be done offline, or statically, with or without a control system, such as to correct pointing and positioning errors during alignment or setup of a lithographic process, for example, or as an occasional adjustment to correct for long-term drift errors.

In order to adjust first lens 102 and second lens 104 in accordance with embodiments of the present invention, actuators may be used. FIGS. 4A and 4B show to example lens mountings 442 (A/B) that include such actuators. Lens mountings 442, shown within their available volumes 444, each include a lens mounting area 446. Lens mounting area 446 may be designed using multiple flexures 448. The flexures 448B shown in FIG. 4B are shown as double cut flexures. However, other types of flexures may be used. Flexures 448 support the lens and are flexible for lens adjustment. Lens mountings 442 may each include cap gauges 450 to measure lens position. Cap gauges 450 may be linear encoders.

Lens mountings 442 also include actuators 452. Actuators 452 may include voice coil actuators, for example. However, other types of actuators may be used. Actuators 452, as shown, can be used to position the lens in two degrees of freedom (X and Y), to adjust beam position and pointing as described throughout this document. The structure of lens mountings 442, the actuators 452, and the flexures 448 act to support and constrain the motion of the lens in all directions. The motion of the lens can be controlled within certain specifications. As an example, the distance the lens can be moved in the X or Y direction may be controlled to be within +/−150 µm, and its accuracy or resolution of position may be controlled to be less than 0.25 µm. As would be understood by those skilled in the relevant art(s), the use of lens mountings 442 is not to be limited to lenses. Lens mountings 442 may also be used with other optical components.

In accordance with embodiments of the present invention, first lens 102 and second lens 104 can each be coupled to (e.g., placed into) a lens mounting 442 (A or B). Actuators 452 of each lens mounting 452 can move or adjust the position of the lens therein. In an embodiment, the adjustment of a lens may be done in response to an actuation signal received by actuator 452. An actuation signal (e.g., a signal 126) may come from one or more controllers, such as controllers 122.

FIG. 5 is a block diagram of an exemplary lithography system 500 that may include a beam positioning and pointing system, according to an embodiment of the present invention. Lithography system 500 includes a light source 570, a beam delivery system 572, an illumination system 574, a patterning device 576, a projection system 578, and a substrate stage 580. Beam positioning and pointing system 100/300 may be located at, but does not need to be limited to, one or more of locations A, B, C, and D, as indicated in FIG. 5. Along an optical path, location A is downstream of light source 570, location B is upstream of beam delivery system 572, location C is within illumination system 574, and location D is downstream of illumination system 574 and upstream of patterning device 576.

It would be understood by one skilled in the relevant art(s) that lithography system 500 is just one example of a system that may include beam positioning and pointing system 100/300, where another exemplary system is shown in FIG. 8. Lithography system 500 may include more than the components shown. Further, each component of lithography system 500 may include many subcomponents, including lenses that may be used as beam positioning and pointing systems as just described. For example, the beam positioning and pointing system at location A may comprise lenses that are actually at the end of light source 570 or at the beginning of beam delivery system 572. Similarly, the beam positioning and pointing system at location B may comprise lenses that are actually at the end of beam delivery system 572 or at the beginning of illumination system 574. Likewise, the beam positioning and pointing system at location D may comprise lenses that are actually at the end of illumination system 574 or at the beginning of patterning device 576. Each beam positioning and pointing system may be used to correct for any beam position and pointing errors that occur prior to it. For each beam positioning and pointing system, first lens 102 and/or second lens 104 may already exist in the system or within the system components, or may be added to the system to provide the beneficial correction. It will also be understood that many other optical systems, lithographical or non-lithographical, may also benefit from using this invention.

FIG. 6 is a flowchart depicting a method 600 of positioning and pointing a light beam, according to an embodiment of the present invention. Method 600 begins at step 602. In step 604, a light beam is directed toward a first optical component, such as a first lens. In step 606, the position of the first lens is adjusted within a first plane perpendicular to a nominal optical axis to adjust the light beam's left-right position, while directing the light beam toward a second optical component, such as a second lens. In step 608, the position of the second lens is adjusted within a second plane perpendicular to the nominal optical axis to adjust the light beam's up-down position to direct the light beam along or within the nominal optical axis or another nominal optical axis. In an embodiment, both nominal optical axes are the same. In another embodiment, each nominal optical axis is different. Each nominal optical axis may be different when parts of the optical system (e.g., lithography system) are associated with more than one structure, for example, as described above with respect to FIG. 3. Method 600 ends at step 610. As would be understood by one skilled in the relevant art(s), a mirror can be substituted for either of the first and second optical components.

FIG. 7 is a flowchart depicting further steps of method 600, according to an alternative embodiment of the present invention. The steps of method 700 of FIG. 7 represent the use of a control system. Method 700 begins at step 702, which may proceed from step 608 of method 600. In step 704, the light beam is directed from the second optical component to one or more sensors. For example, a sensor may be sensitive to beam positioning, or pointing, or both. In step 706, data and/or one or more signals are provided from the one or more sensors to one or more controllers that are coupled to the first and second lenses. In step 708, steps 606, 608, 704, and 706 are repeated as needed, for example, this may be done at the direction of the controller(s) based on the data and/or one or more signals provided by the sensor(s). In step 710, method 700 proceeds to step 610 and ends.

The above-described beam positioning and pointing system may be used to correct beam positioning and beam pointing (i.e., telecentricity) in optical systems, including lithography systems. It is to be appreciated that the above-described embodiments may be used in conventional mask-based lithography as well as maskless lithography. However, a mask-based system is less likely to need the correction that this invention can provide because more light pulses are used than in a maskless system. The invention may also be used for immersion lithography, interferometric lithography, or in other systems that include a similar functioning optical system.

Although the above-described embodiments describe a first lens to position a light beam, and a second lens to point the light beam, this is not a necessity, but instead an easily understood way of envisaging the invention. Both lenses may work together to correct the positioning and pointing of a light beam, and it does not matter whether positioning or pointing is corrected first.

No additional cost may be required, if lenses are already included in an optical system located prior to a field image plane. Also, a much smaller polarization effect than that of additional mirrors may result. A further possible result is the addition of only negligible path length as opposed to the additional volume needed for the folding of mirrors.

FIG. 8 depicts a lithographic apparatus according to an embodiment of the invention. The apparatus comprises an illumination system IL, a support structure MT, a substrate table WT, and a projection system PS.

The illumination system IL is configured to condition a radiation beam B (e.g., a beam of UV radiation as provided by a mercury arc lamp, or a beam of DUV radiation generated by a KrF excimer laser or an ArF excimer laser).

The support structure (e.g., a mask table) MT is constructed to support a patterning device (e.g., a mask or dynamic patterning device) MA having a mask pattern MP and connected to a first positioner PM configured to accurately position the patterning device in accordance with certain parameters.

The substrate table (e.g., a wafer table) WT is constructed to hold a substrate (e.g., a resist-coated wafer) W and connected to a second positioner PW configured to accurately position the substrate in accordance with certain parameters.

The projection system (e.g., a refractive projection lens system) PS is configured to project a pattern imparted to the radiation beam B by the pattern MP of the patterning device MA onto a target portion C (e.g., comprising one or more dies) of the substrate W.

The illumination system may include various types of optical components, such as refractive, reflective, and diffractive types of optical components, or any combination thereof, for directing, shaping, or controlling radiation. The illumination system may also include a positioning and pointing system, as described above with respect to FIGS. 1, 3, and 5.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern MP includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which may be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, and catadioptric optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 8, the illumination system IL receives a radiation beam from a radiation source SO. The source and the lithographic apparatus may be separate entities, for example when the source is an excimer laser. In such cases, the radiation beam is passed from the source SO to the illumination system IL with the aid of a beam delivery system BD comprising, for example, suitable directing mirrors and/or a beam expander. In other cases the source may be an integral part of the lithographic apparatus, for example when the source is a mercury lamp. The source SO and the illumination system IL, together with the beam delivery system BD if required, may be referred to as a radiation system.

The illumination system IL may comprise an adjuster AD for adjusting the angular intensity distribution of the radiation beam at mask level. Generally, at least the outer and/or inner radial extent (commonly referred to as σ-outer and σ-inner, respectively) of the intensity distribution in a pupil IPU of the illumination system can be adjusted. In addition, the illumination system IL may comprise various other components, such as an integrator IN and a condenser CO. The illumination system may be used to condition the radiation beam, to have a desired uniformity and intensity distribution in its cross-section at mask level.

The radiation beam B is incident on the patterning device (e.g., mask MA or programmable patterning device), which is held on the support structure (e.g., mask table MT), and is patterned by the patterning device in accordance with a pattern MP. Having traversed the mask MA, the radiation beam B passes through the projection system PS, which focuses the beam onto a target portion C of the substrate W.

The projection system has a pupil PPU conjugate to the illumination system pupil IPU, where portions of radiation emanating from the intensity distribution at the illumination system pupil IPU and traversing a mask pattern without being affected by diffraction at a mask pattern create an image of the intensity distribution at the illumination system pupil IPU.

With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 8) may be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation may be readily applied to maskless lithography that utilizes a programmable patterning device, such as a programmable mirror array of a type as referred to above.

Combinations and/or variations on the above described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultraviolet (EUV) radiation (e.g. having a wavelength in the range of 5-20 nm).

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A beam pointing and positioning system comprising:
   a first lens comprising a first plane perpendicular to a first nominal optical axis, the first lens being configured to:
      receive a light beam at an angle with the first nominal axis, and
      move a first distance in the first plane; and
   a second lens comprising a second plane perpendicular to the first nominal optical axis, the second lens being configured to:
      move a second distance in the second plane; and
      output a resulting light beam perpendicular to a third plane and parallel to a second nominal optical axis that is perpendicular to the third plane,
   wherein the first distance or the second distance is dependent on a ratio of a position of the first lens and a distance between the first lens and the second lens,
   thereby the beam pointing and positioning system is capable of directing the light beam to a desired location at a desired angle.

2. The beam pointing and positioning system of claim 1, wherein the first lens is configured to adjust a direction of the light beam.

3. The beam pointing and positioning system of claim 2, wherein the second lens is configured to direct the adjusted light beam output from the first lens along the second nominal optical axis.

4. The beam pointing and positioning system of claim 1, wherein the first nominal optical axis and the second nominal optical axis are same.

5. The beam pointing and positioning system of claim 1, further comprising:
   a beam splitter configured to receive, transmit, and reflect at least a portion of the resulting light beam that is output from the second lens;
   a sensor configured to receive the reflected light beam; and
   a controller, coupled to the sensor and the first and second lenses, configured to control the movement of the first and second lenses based on a signal received from the sensor.

6. The beam pointing and positioning system of claim 5, wherein the first and second lenses, the beam splitter, and the sensor are associated with a single structure.

7. The beam pointing and positioning system of claim 5, wherein:
   the first and second lenses are associated with a first structure; and
   the beam splitter and the sensor are associated with a second structure that is separate from the first structure.

8. The beam pointing and positioning system of claim 1, further comprising:
   a light source configured to produce the light beam;
   an illumination system configured to process the light beam;

a beam delivery system configured to direct the light beam between the light source and the illumination system; and a patterning device configured to pattern the resulting light beam.

9. The beam pointing and positioning system of claim 8, wherein the patterning device comprises a reticle or a mask.

10. The beam pointing and positioning system of claim 8, wherein the patterning device comprises an array of individually programmable elements.

11. The beam pointing and positioning system of claim 8, wherein the first and second lenses are located downstream of the light source and upstream of the beam delivery system along an optical path.

12. The beam pointing and positioning system of claim 8, wherein the first and second lenses are located downstream of the beam delivery system and upstream of the illumination system along an optical path.

13. The beam pointing and positioning system of claim 8, wherein the first and second lenses are located within the illumination system.

14. The beam pointing and positioning system of claim 8, wherein the first and second lenses are located upstream of the patterning device.

15. A method of positioning and pointing a light beam comprising:
   directing a light beam toward a first lens comprising a first plane perpendicular to a first nominal optical axis;
   adjusting a position of the first lens by moving the first lens a first distance within the first plane;
   directing the light beam toward a second lens comprising a second plane perpendicular to the first nominal optical axis;
   adjusting a position of the second lens by moving the second lens a second distance within the second plane,
   wherein the first distance or the second distance is dependent on a ratio of a position of the first lens and a distance between the first lens and the second lens;
   outputting a resulting light beam perpendicular to a third plane and parallel to a second nominal optical axis that is perpendicular to the third plane.

16. The method of claim 15, wherein the first and second nominal axes are same.

17. The method of claim 15, wherein the first and second nominal axes are different.

18. The method of claim 15, further comprising:
   directing the resulting light beam from the second lens to a sensor;
   providing a signal from the sensor to a controller; and
   repeating the adjusting of the positions of the first and second lenses and the directing of the resulting light beam to the sensor based on the signal provided by the sensor.

19. The method of claim 15, wherein the adjusting of the positions of the first and second lenses occurs during setup of a lithographic operation.

20. The method of claim 15, wherein the adjusting of the positions of the first and second lenses occurs in real time during a lithographic operation.

21. A lithography system comprising:
   a source of radiation configured to emit a beam of radiation;
   an illumination system configured to process the beam of radiation;
   a patterning device configured to pattern the processed beam of radiation;
   a projection system configured to project the patterned beam of radiation onto a target portion of a substrate; and
   a beam pointing and positioning system configured to direct the beam of radiation to a desired location at a desired angle, the beam pointing and positioning system comprising:
      a first lens comprising a first plane perpendicular to a first nominal optical axis, the first lens being configured to move a first distance in the first plane; and
      a second lens comprising a second plane perpendicular to the first nominal optical axis, the second lens being configured to:
         move a second distance in the second plane; and
         output a resulting beam of radiation perpendicular to a third plane and parallel to a second nominal optical axis that is perpendicular to the third plane,
      wherein the first distance or the second distance is dependent on a ratio of a position of the first lens and a distance between the first lens and the second lens.

22. The lithography system of claim 21, wherein the first and second nominal axes are same.

23. The lithography system of claim 21, wherein the first and second nominal axes are different.

24. The lithography system of claim 21, further comprising:
   a beam delivery system configured to:
      receive the beam of radiation from the source of radiation; and
      direct the beam of radiation to the illumination system,
      wherein the beam pointing and positioning system is downstream of the source of radiation and upstream of the beam delivery system.

25. The lithography system of claim 21, further comprising:
   a beam delivery system configured to:
      receive the beam of radiation from the source of radiation; and
      direct the beam of radiation to the illumination system,
      wherein the beam pointing and positioning system is downstream of the beam delivery system and upstream of the illumination system.

26. The lithography system of claim 21, wherein the beam pointing and positioning system is located within the illumination system.

27. The lithography system of claim 21, wherein the beam pointing and positioning system is located upstream of the patterning device.

28. The lithography system of claim 21, further comprising:
   a beam splitter configured to receive, transmit, and reflect at least a portion of the resulting beam of radiation;
   a sensor configured to receive the reflected beam of radiation; and
   a controller, coupled to the sensor and the first and second lenses, configured to control the movement of the first and second lenses based on signals received from the sensor.

29. The lithography system of claim 28, wherein the first and second lenses, the beam splitter, and the sensor are associated with a single structure.

30. The lithography system of claim 28, wherein:
   the first and second lenses are located on a first structure; and
   the beam splitter and the sensor are associated with a second structure that is separate from the first structure.

31. A beam control system for lithographic processing, the beam control system comprising:

a first lens comprising a first plane perpendicular to a first nominal optical axis;

a second lens comprising a second plane perpendicular to the first nominal optical axis;

a first lens actuator, coupled to the first lens, configured to move the first lens in the first plane in response to a first actuation signal; and a second lens actuator, coupled to the second lens, configured to:
move the second lens in the second plane in response to a second actuation signal; and
output a resulting light beam perpendicular to a third plane and parallel to a second nominal optical axis that is perpendicular to the third plane,
wherein the first distance or the second distance is dependent on a ratio of a position of the first lens and a distance between the first lens and the second lens.

32. The beam control system of claim 31, further comprising:
a controller, coupled to the first and second lens actuators, configured to:
provide the first actuation signal to control position of the light beam; and
provide the second actuation signal to control directing of the resulting light beam.

33. The beam control system of claim 32, further comprising:
a first sensor, coupled to the controller, configured to detect position of the light beam at a particular location.

34. The beam control system of claim 33, further comprising:
a second sensor, coupled to the controller, configured to detect position of the resulting light beam at a particular angle.

35. The beam control system of claim 34, further comprising:
a feedback loop, coupled to the first and second sensors, configured to control the movement of the first lens in the first plane based on a first sensor signal or the movement of the second lens in the second plane based on a second sensor signal for correcting at least one of pointing or positioning errors during the lithographic processing.

36. A beam pointing and positioning system comprising:
an adjustable first optical component comprising a first plane perpendicular to a first nominal optical axis, the adjustable first optical component configured to move a first distance in the first plane; and
an adjustable second optical component comprising a second plane perpendicular to the first nominal optical axis, the adjustable second optical component being configured to:
move a second distance in the second plane; and
output a resulting light beam perpendicular to a third plane and parallel to a second nominal optical axis that is perpendicular to the third plane,
wherein the first distance or the second distance is dependent on a ratio of a position of the first lens and a distance between the first lens and the second lens,
thereby the beam pointing and positioning system is capable of directing the light beam to a desired location at a desired angle.

37. The beam pointing and positioning system of claim 36, wherein one of the first optical component and the second optical component is a lens or a mirror.

* * * * *

UNITED STATES PATENT AND TRADEMARK OFFICE
CERTIFICATE OF CORRECTION

PATENT NO.        : 9,075,324 B2
APPLICATION NO.   : 11/840821
DATED             : July 7, 2015
INVENTOR(S)       : Zimmerman et al.

Page 1 of 1

It is certified that error appears in the above-identified patent and that said Letters Patent is hereby corrected as shown below:

In the claims

Col. 13, line 39, claim 15, after "second lens;", insert --and--.

Signed and Sealed this
Eighth Day of December, 2015

Michelle K. Lee
*Director of the United States Patent and Trademark Office*